United States Patent [19]

Matsumoto

[11] Patent Number: 5,434,802
[45] Date of Patent: Jul. 18, 1995

[54] METHOD OF DETECTING THE INCLINATION OF AN IC

[75] Inventor: Koji Matsumoto, Tokyo, Japan

[73] Assignee: Ezel Inc., Tokyo, Japan

[21] Appl. No.: 72,964

[22] Filed: Jun. 8, 1993

[30] Foreign Application Priority Data

Jun. 9, 1992 [JP] Japan .................. 4-174784

[51] Int. Cl.$^6$ ............................................. G06K 9/52
[52] U.S. Cl. .................... 364/559; 382/145
[58] Field of Search ............... 364/516, 559, 489, 490; 382/8, 16, 25, 28, 48; 356/375, 376

[56] References Cited

U.S. PATENT DOCUMENTS

| | | | |
|---|---|---|---|
| 4,424,588 | 1/1984 | Satoh et al. ............. | 364/516 X |
| 4,450,579 | 5/1984 | Nakashima et al. ....... | 382/8 |
| 4,845,764 | 7/1989 | Ueda et al. ............. | 382/8 |
| 4,981,372 | 1/1991 | Morimoto et al. ....... | 382/8 |

FOREIGN PATENT DOCUMENTS

| | | |
|---|---|---|
| 0062335 | 10/1982 | European Pat. Off. . |
| 0222072 | 5/1987 | European Pat. Off. . |
| 0374848 | 6/1990 | European Pat. Off. . |

OTHER PUBLICATIONS

Loomis, "Edge-Finding Algorithm with Subpixel Resolution", Vision '89, Conference Proceedings, Apr. 1989, pp. 8-33 to 8-46.

Primary Examiner—Emanuel T. Voeltz
Assistant Examiner—Edward Pipala
Attorney, Agent, or Firm—Cushman, Darby & Cushman

[57] ABSTRACT

The present invention provides a method of detecting the inclination of an IC to determine its position for arranging the sides of the IC parallel to an X-axis and Y-axis speedily and precisely without using image information of binarized images or an image of each pin. This method includes the steps of: inputting an image of an IC; defining a plurality of checking areas at predetermined positions in the image, wherein each checking area includes open ends of a plurality of IC pins; generating a density projection along a direction parallel to IC pins in each checking area; detecting the maximum value of a primary differential at the open ends of the IC pins; defining a representative point at a predetermined position on a line along the open ends; and calculating inclination of the IC according to the inclination of a reference line connecting the representative points of the checking areas.

6 Claims, 5 Drawing Sheets

METHOD OF DETECTING THE INCLINATION OF AN IC

BACKGROUND OF THE INVENTION

1. Field of the Invention

The present invention relates to a method for detecting the inclination of an IC to fix a position of the IC for mounting the IC on a board, for example.

2. Description of the Related Art

To mount an IC at a predetermined position on a circuit board, it is necessary to determine the exact position of the IC. In order to find the exact position of the IC, it is necessary to locate a center of the IC and its angle of the inclination. It is known to extract the center of an IC and its angle of inclination using image processing wherein the image to be extracted is binarized in order to increase the processing speed. However, the binarized image is easily damaged by a change in the degree of brightness of lights used in the image processing. As a result, the precise measuring value cannot be guaranteed. Also, improvements in the minute processing technology of LSI circuits has developed a high accumulation of components on the LSI circuit so that the number of lead pins is increased. As a result, the width of the pins have become thinner, and, therefore, it is impossible to exactly recover the pin as an image. Also, it is difficult to calculate an angle of inclination of the IC according to the image information of each pin.

SUMMARY OF THE INVENTION

The present invention solves the above discussed problems with conventional imaging systems, and provides a method of detecting the inclination angle of an IC in order to fix a position of the IC speedily and precisely without the need to use the image information of binarized images or an image of each pin.

A method of detecting the inclination angle of an IC relating to this invention defines a plurality of checking areas, including open ends of a plurality of IC pins, in the neighborhood of each side of an IC package, extracts open ends of an IC from a density projection of each checking area, calculates a representative point on a line along the open ends, calculates an approximate line substantially passing through the representative point on each side, and calculates a center and an inclination of an IC according to a crossing point and an inclination of these approximate lines.

PREFERRED EMBODIMENT OF THE PRESENT INVENTION

Figure 1:
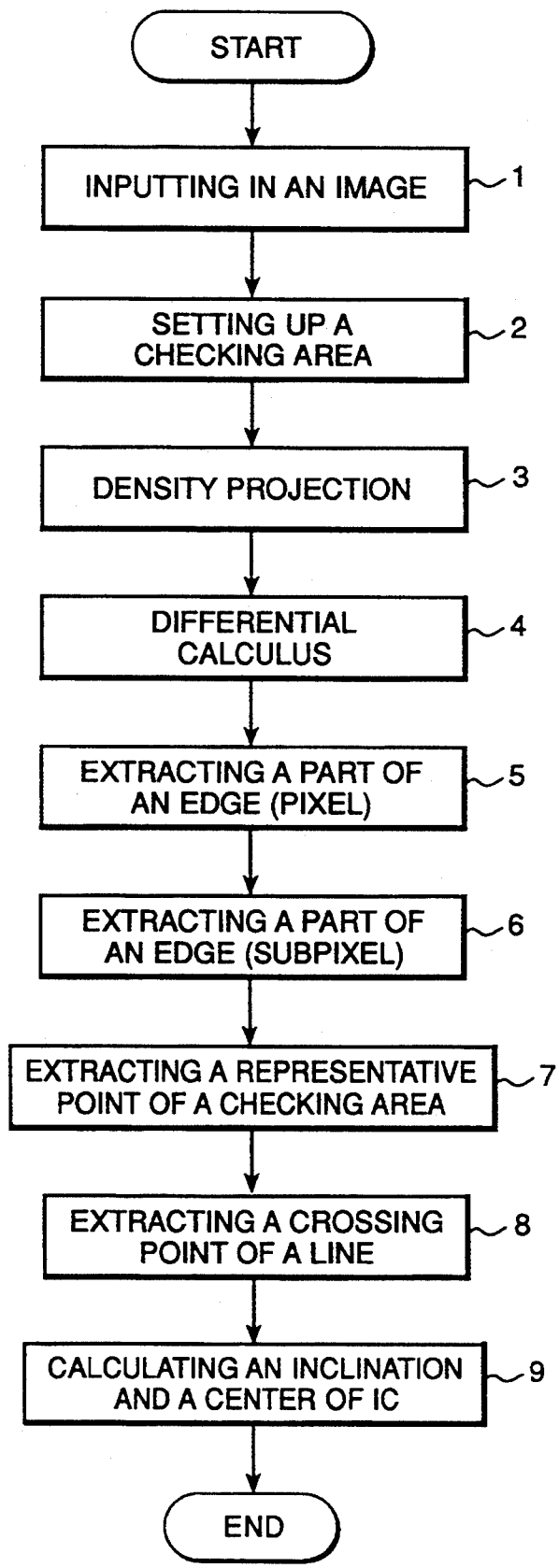
FIG. 1 is a flow chart showing an embodiment of the present invention.

Hereinafter, an embodiment of a method of detecting an inclination angle of an IC according to the principles of the present invention is described with reference to the attached drawings. FIG. 1 is a flow chart showing an embodiment of the present invention.

First, an image of an IC with pins 20 located on four sides of QFP type etc. is taken in step 1. The density value of the background and that of each pin is different.

Figure 2:
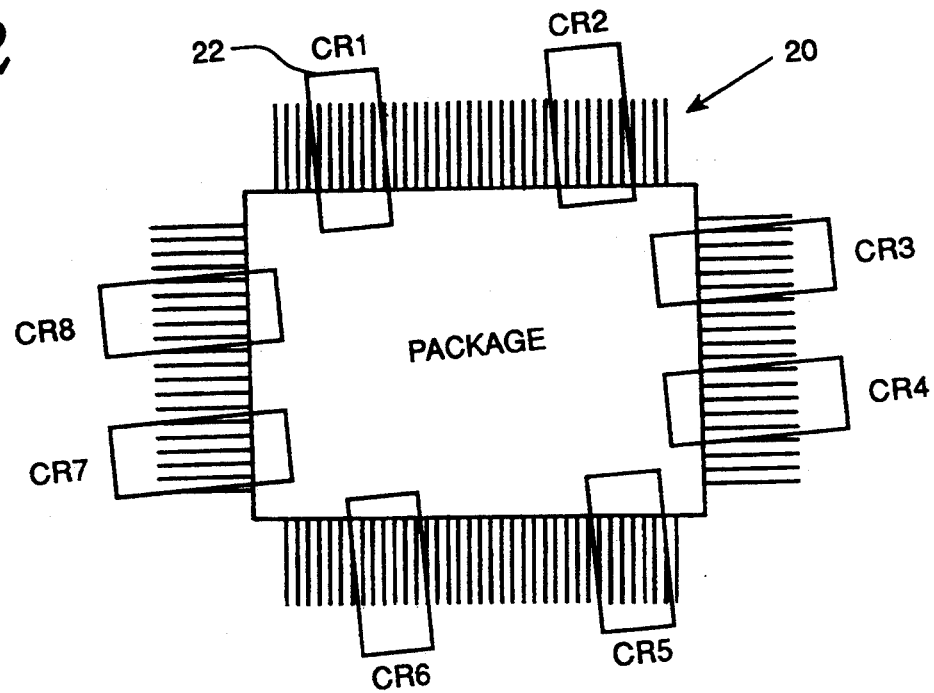
FIG. 2 is a conceptual diagram showing the method for setting a checking area.

In step 2, checking areas 22 are set at predetermined positions in the image of the IC (FIG. 2). Several checking areas are set on each side of the IC. In the embodiment illustrated in FIG. 2, two checking areas 22 are used for each group of pins as an example for purposes of illustration. In each of these checking areas 22, open ends of IC pins 20 must be included. That is, the ends of pins 20 distal from the IC chip must be included in the checking area 22.

Figure 3:
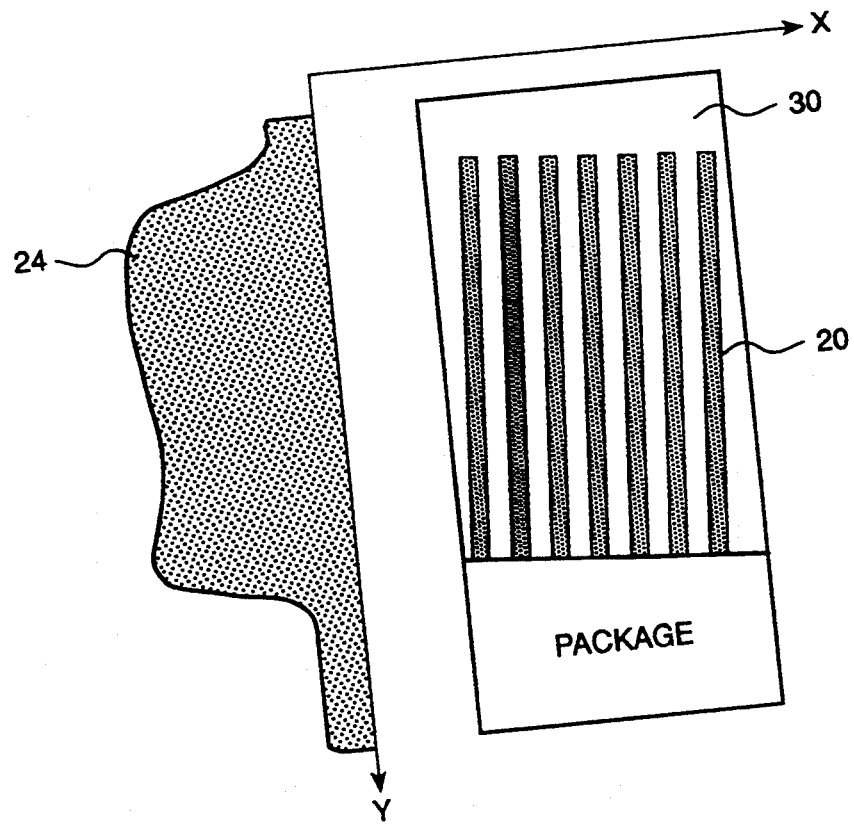
FIG. 3 is a conceptual diagram of a density projection of one of the checking areas.

A density projection for each of the checking area is generated in step 3. As illustrated in FIG. 3, checking area CR1, for example, generates a density projection 24 in a direction generally parallel to a Y-direction.

When performing a density projection 24 of a pin part, it is not necessary to use the information of each pin image. It would be increasingly difficult to use the image for each pin 20 because, as the integration of transistors on LSIs increases due to improved manufacturing technology, the number of pins is increased and the width of each pin is narrowed. Because the present invention uses a density proportion, it is possible to deal with these conditions.

Furthermore, the density projection 24 is multi-valued and represents a total integration of the data of light and shade of an image. Therefore, the density projection includes highly reliable information as compared to a binarized image lacking information, for information compression.

Figure 4:
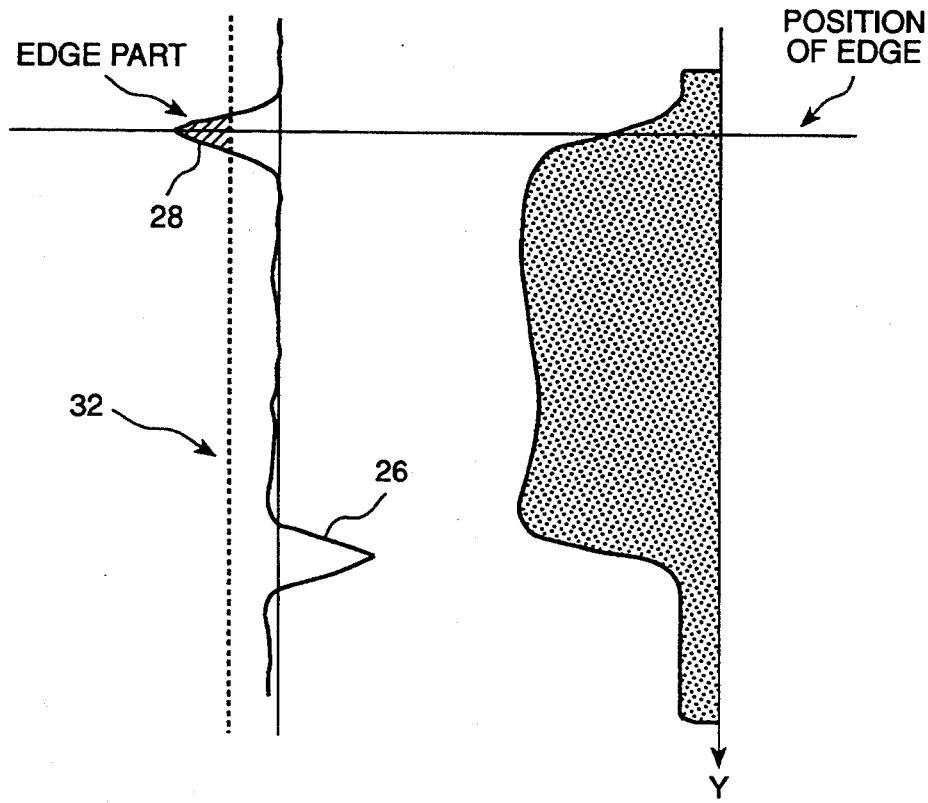
FIG. 4 is a diagram explaining a primary differential and a part of an edge of checking area CR1 illustrated in FIG. 2.

In step 4, the primary differential is performed for the density projection generated in step 3. FIG. 4 shows the differential result 26 as a thick line. As the result of this calculation, a line along the open ends of the IC pins 10, that is, a boundary point in the Y-axis direction, is emphasized as a spike 28 in differential result 26. A boundary point is expressed as an "edge" hereafter.

In checking area CR1, the first rising part, i.e., spike 28 of differential result 26 in a direction from large to small values in the Y-coordinates is an edge between the background 10 and the pins 20.

In order to calculate a position of the edge in step 5, first a threshold comparison is performed. That is, the threshold value is calculated. The threshold value is shown as broken line 32 in FIG. 4. The part of differential result 26 over threshold value 32 (a part of oblique lines) is judged to be the edge of the pins.

In order to set uniform threshold values, it is better to perform the normalization after a primary differential has been calculated.

Figure 5:
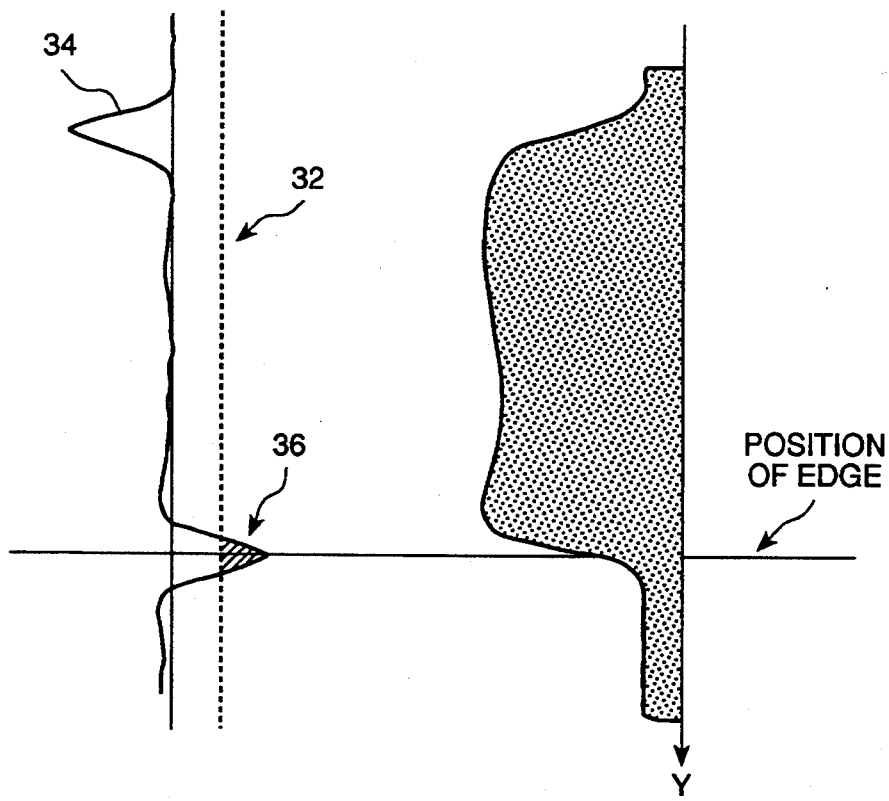
FIG. 5 is a diagram explaining a primary deferential and a part of an edge of checking areas CR5 and CR6 illustrated in FIG. 2.

FIG. 5 shows a density projection of checking areas CR5 and CR6, which are located on opposite sides of the IC from checking areas CR1 and CR2. The primary differential result 34 based on the density projection is obtained as discussed above with respect to checking area CR1. That is, the differential result 32 is compared to a threshold value 32 (a broken line) and an edge 36 as illustrated by oblique lines is detected. Naturally, in checking areas CR5 and CR6, which are on opposite sides of CR1 and CR2, edge 36 occurs where the first rising of differential result 34 in a Y-coordinate direction from small to large values takes place.

Figure 6:
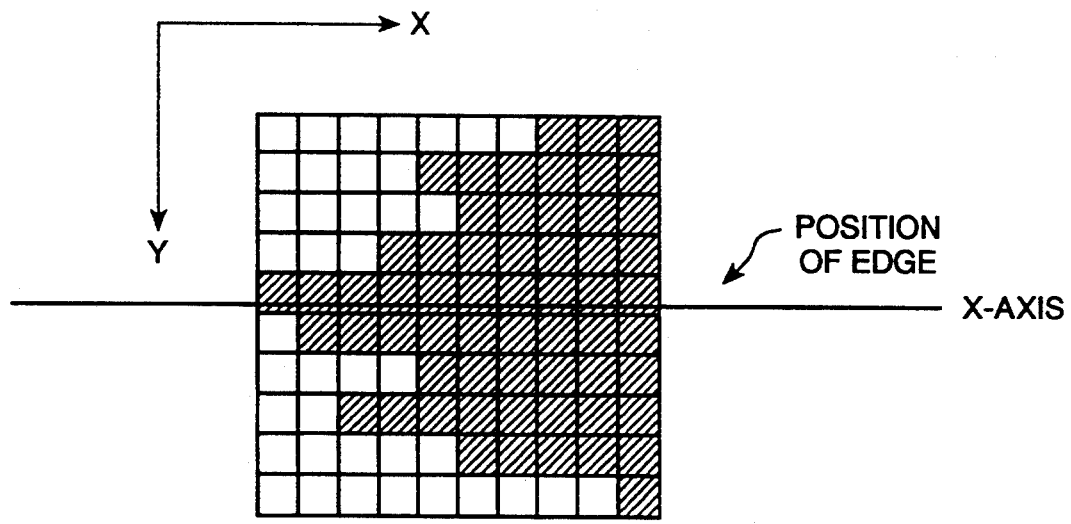
FIG. 6 is a diagram explaining an edge position detection performed on a sub-pixel unit basis.

In step 6, a more precise position of an edge is extracted by a sub-pixel unit. FIG. 6 shows a part of the edge extracted using the maximum value for the primary differential result as discussed above. It is usual in a pixel representation that the edge is uneven as illustrated in FIG. 6. In order to calculate more accurately the position of the edge, that is the Y-coordinates of the edge, from such image data, sub-pixels must be considered. As a result, it is possible to obtain a more exact and more precise Y-coordinates for the edge (FIG. 6 shows a line of X-axis of the coordinates) than the method for obtaining the Y-coordinates by a pixel unit based on the maximum value of a primary differential result.

Figure 7:
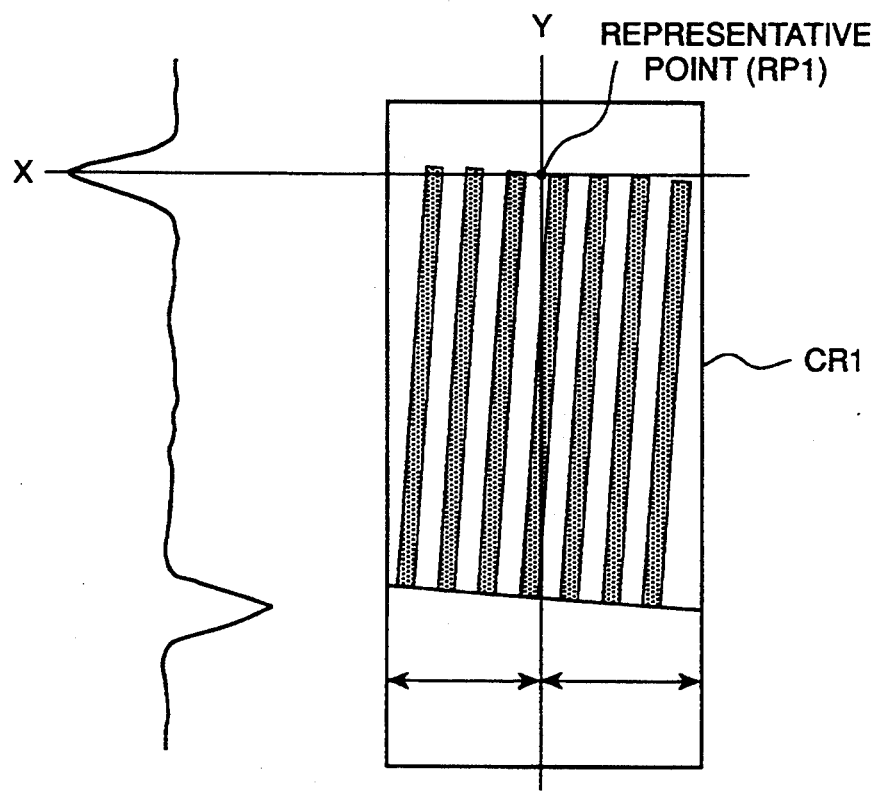
FIG. 7 is a conceptual diagram showing a representative point of a checking area.

Next, calculating the X-coordinates of a central point of a width in the X-axis direction of a checking area CR1, as shown in FIG. 7, is performed in step 7; the crossing point of the X-axis of the Y-coordinates obtained on step 6 and that of the Y-axis of the X-coordinates are calculated. These points are defined as a representative point RP1 of checking area CR1.

With respect to the processing from step 1 to step 7 for checking areas CR3, CR4, CR7 and CR8 at the left and the right side of the IC, the X and Y-axis are opposite to that described above and illustrated in FIGS. 5-7. For example, a density projection is located in the direction of the X-axis.

Figure 8:
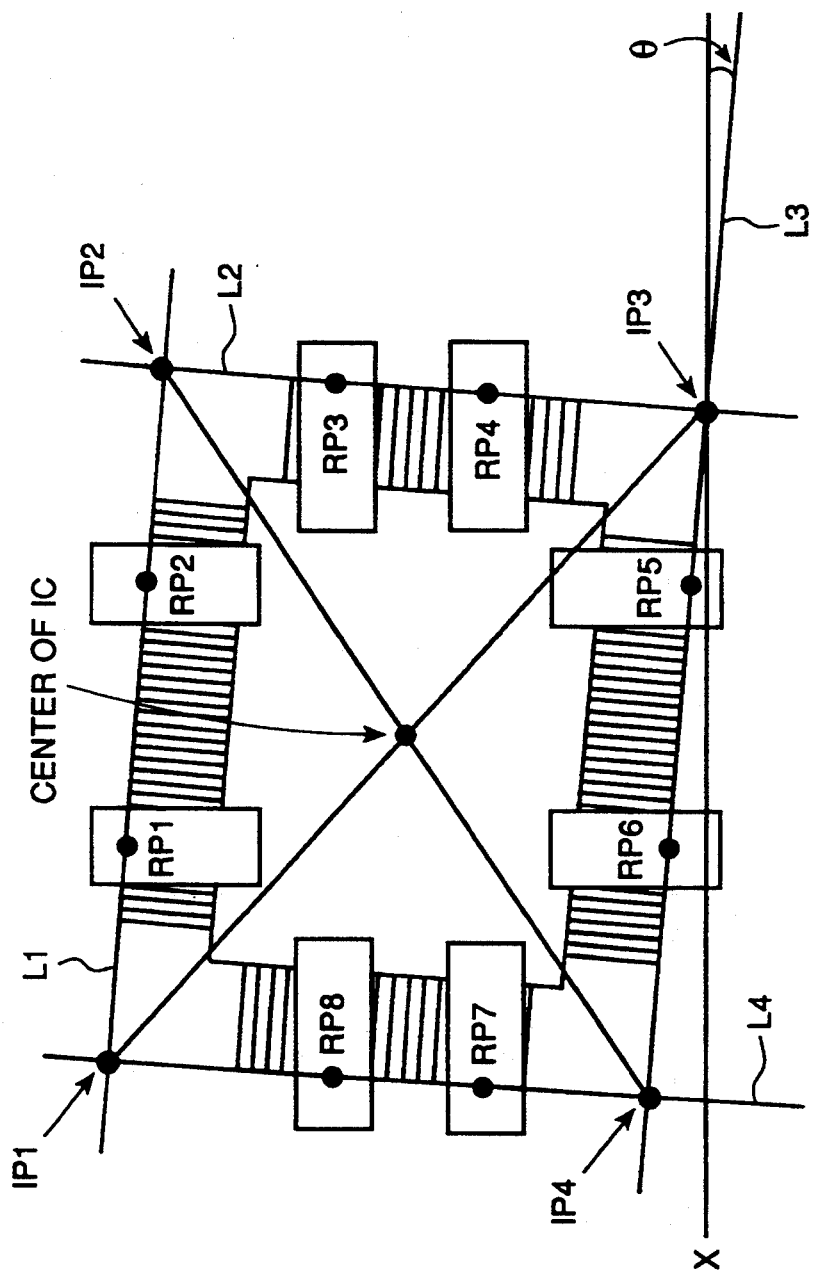
FIG. 8 is a conceptual diagram showing a method for detecting a center of an IC and an inclination angle of an IC according to the principles of the present invention.

As mentioned above, a representative point for all of the checking areas is calculated. In FIG. 8, each checking area is described by RP1 to RP8.

In step 8, as illustrated in FIG. 8, lines passing through the representative points corresponding to the checking areas along each side of the IC are calculated. These lines are illustrated in FIG. 8 by lines L1, L2, L3 and L4. The crossing points of these lines are shown by points IP1, IP2, IP3 and IP4.

Where more than three checking areas are set on each side of an IC, an approximate line corresponding to the representative points of each checking area is to be obtained, for example, by calculating an approximate line of the minimum squared differential; the cross points are extracted.

On step 9, the center of a line connecting IP1 and IP3 is extracted and it becomes a center of the IC. It also is possible to calculate the center of the IC by extracting the crossing point of two lines; one line connecting IP1 and IP3; and the other line connecting IP2 and IP4.

An inclination angle Θ of an IC can be calculated by determining the angle between line L3 and the X-coordinate shown in FIG. 8. It is also possible to calculate mean values, for example, according to an angle between the axis coordinates and all lines located along the X-axis of the IC, such as lines L1 and L3.

As mentioned above, it is possible to calculate the inclination angle of the IC at high speeds by the present invention because the checking area is small and, therefore, the necessary time for processing is short.

Then the calculated center of IC is defined as a center of the IC, and the IC having the inclined angle can be rotated and amended to alter its angle at inclination.

The present invention mentioned above can exactly extract the inclination of an IC at high speed without the information of a binarized image or each pin image, and can amend the inclination after the extraction easily.

What is claimed is:

1. A method of detecting an inclination of an integrated circuit, IC, having a plurality of pins for arranging sides of said IC approximately parallel to an X-axis and a Y-axis, comprising steps of:
    i) generating an image of an IC;
    ii) defining a plurality of checking areas at predetermined positions in said image, wherein each of said checking areas includes therein ends of at least two of said plurality of pins distal from said IC;
    iii) generating a density projection in a direction parallel to a length of individual pins in said at least two of said plurality of pins in each checking area;
    iv) calculating a primary differential of said density projection;
    v) locating a position of a maximum value of said primary differential of said density projection, said maximum value corresponding to a line extending along said ends of said at least two of said plurality of pins in said checking area;
    vi) defining a representative point at a predetermined position on said line extending along said ends of said at least two of said plurality of pins in each of said checking areas; and
    vii) calculating said inclination of said IC based on an inclination of a reference line connecting said representative points of said checking areas.

2. A method of detecting an inclination of an IC as claimed in claim 1, wherein said representative point is located on said line at a mid-point thereof with respect to a width of said checking area.

3. A method of detecting an inclination of an IC as claimed in claim 1, wherein said reference line is a line of the minimum squared error corresponding to each representative point.

4. A method of detecting an inclination of an IC as claimed in claim 1, wherein said inclination is calculated using only one reference line and a crossing angle of said reference line and a coordinate axes.

5. A method of detecting an inclination of an IC as claimed in claim 1, wherein said inclination is calculated using all reference lines and evaluating an inclination between each line and a coordinate axis.

6. A method of detecting an inclination of an IC claimed in claim 5, wherein said step of evaluating an inclination between each reference line and a coordinate axis is performed using mean values.

* * * * *